(12) United States Patent
Gan (10) Patent No.: US 10,672,801 B2
(45) Date of Patent: Jun. 2, 2020

(54) TFT SUBSTRATE

(71) Applicants: Shenzhen China Star Optoelectronics Semiconductor Display Technology Co., Ltd., Shenzhen (CN); Jianfeng Wang

(72) Inventor: Qiming Gan, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/749,103

(22) PCT Filed: Jan. 4, 2018

(86) PCT No.: PCT/CN2018/071411
§ 371 (c)(1),
(2) Date: Jan. 30, 2018

(87) PCT Pub. No.: WO2019/100546
PCT Pub. Date: May 31, 2019

(65) Prior Publication Data
US 2019/0164994 A1    May 30, 2019

(30) Foreign Application Priority Data

Nov. 27, 2017  (CN) .......................... 2017 1 1209138

(51) Int. Cl.
*H01L 27/14*  (2006.01)
*H01L 27/12*  (2006.01)
(Continued)

(52) U.S. Cl.
CPC ...... *H01L 27/124* (2013.01); *G02F 1/134336* (2013.01); *G09G 3/20* (2013.01);
(Continued)

(58) Field of Classification Search
CPC .................................................... H01L 27/124
See application file for complete search history.

(56) References Cited

U.S. PATENT DOCUMENTS

| | | | |
|---|---|---|---|
| 2010/0220116 A1* | 9/2010 | Liao | G09G 3/3659 345/690 |
| 2014/0036188 A1* | 2/2014 | Chen | G02F 1/136286 349/43 |

(Continued)

FOREIGN PATENT DOCUMENTS

| | | |
|---|---|---|
| CN | 103323992 A | 9/2013 |
| CN | 106405968 A | 2/2017 |

(Continued)

*Primary Examiner* — Didarul A Mazumder
*Assistant Examiner* — Wasiul Haider
(74) *Attorney, Agent, or Firm* — Leong C. Lei (57) ABSTRACT

The present invention provides a TFT substrate. The TFT substrate includes: a first display area and a second display area that are sequentially arranged in a vertical direction. Main pixel electrodes and sub pixel electrodes of the first display area are arranged in mirror symmetry with respect to main pixel electrodes and sub pixel electrodes of the second display area, respectively, about a horizontal division line of the first display area and the second display area. A scanning direction of the first display area is such that scanning is conducted from the side that the sub pixel electrode of one of the sub-pixels of the first display area is located toward the side that the main pixel electrode of the one of the sub-pixels is located. A scanning direction of the second display area is opposite to the scanning direction of the first display area. Thus, the first display area and the second display area generate, during scanning, a coupling signal first and then a pixel voltage is written in to thereby prevent the coupling signal from affecting the pixel voltage to cause poor displaying.

10 Claims, 5 Drawing Sheets

(51) Int. Cl.
  *G02F 1/1343* (2006.01)
  *G09G 3/20* (2006.01)
  *G02F 1/1362* (2006.01)

(52) U.S. Cl.
  CPC .. *G02F 1/134309* (2013.01); *G02F 1/136286* (2013.01); *G02F 2001/134345* (2013.01); *G09G 2300/0426* (2013.01)

(56) References Cited

U.S. PATENT DOCUMENTS

2016/0322017 A1     11/2016  Kang et al.
2016/0341991 A1 *   11/2016  Lee .................... G02F 1/1337

FOREIGN PATENT DOCUMENTS

| CN | 106842750 A |   | 6/2017  |
|----|-------------|---|---------|
| CN | 107357103 A | * | 7/2017  |
| CN | 107329339 A |   | 11/2017 |
| CN | 107357103 A |   | 11/2017 |

* cited by examiner

TFT SUBSTRATE

BACKGROUND OF THE INVENTION

1. Field of the Invention

The present invention relates to the field of display technology, and more particular to a thin-film transistor (TFT) substrate.

2. The Related Arts

Liquid crystal display (LCD) is one of the most commonly used flat panel displays that are used currently. A liquid crystal panel is a core component of the liquid crystal display. The liquid crystal panel is generally made up of a color filter (CF) substrate, a thin-film transistor (TFT) array substrate, and a liquid crystal layer disposed between the two substrates. Generally, the array substrate and the color filter substrate are respectively provided with a pixel electrode and a common electrode disposed thereon. When a voltage is applied to the pixel electrode and the common electrode, an electric field is generated in the liquid crystal layer. The electric field determines the orientation of the liquid crystal molecules in order to regulate the polarization of light incident into the liquid crystal layer, making the liquid crystal panel displaying an image.

With the progress of the displaying technology, large-sized screens, high resolutions, and high refresh rates are now the targets pursued for the liquid crystal display panels. One drawback of the large-sized screens is color shifting at a large view angle. A mainstream solution for such a problem is multi-domain displaying. An example is a pixel arrangement for 8-domain displaying. Specifically, a sub-pixel is divided into a main area and a sub area and a pixel electrode in a "Pozidriv" form including two crosses superimposed with each other by angularly shifting away from each other by 45 degrees is provided in each of the main area and the sub area. The pixel electrode in the Pozidriv form comprises a vertical trunk in the form of a strip and a horizontal trunk in the form of a strip, wherein the vertical trunk and the horizontal trunk perpendicularly intersect each other at centers thereof. Perpendicularly intersecting at the centers refers to the vertical trunk and the horizontal trunk being perpendicular to each other and the two equally divide an entire pixel area into four domains. Each of the domains comprises strip branches defined as slits laid flat at a predetermined angle with respect to the vertical trunk or the horizontal trunk. Each strip branch and the vertical and horizontal trunks are located on the same plane to form the "Pozidriv" structure of the pixel electrode that is symmetric in both up-down direction and left-right direction.

Figure 1:
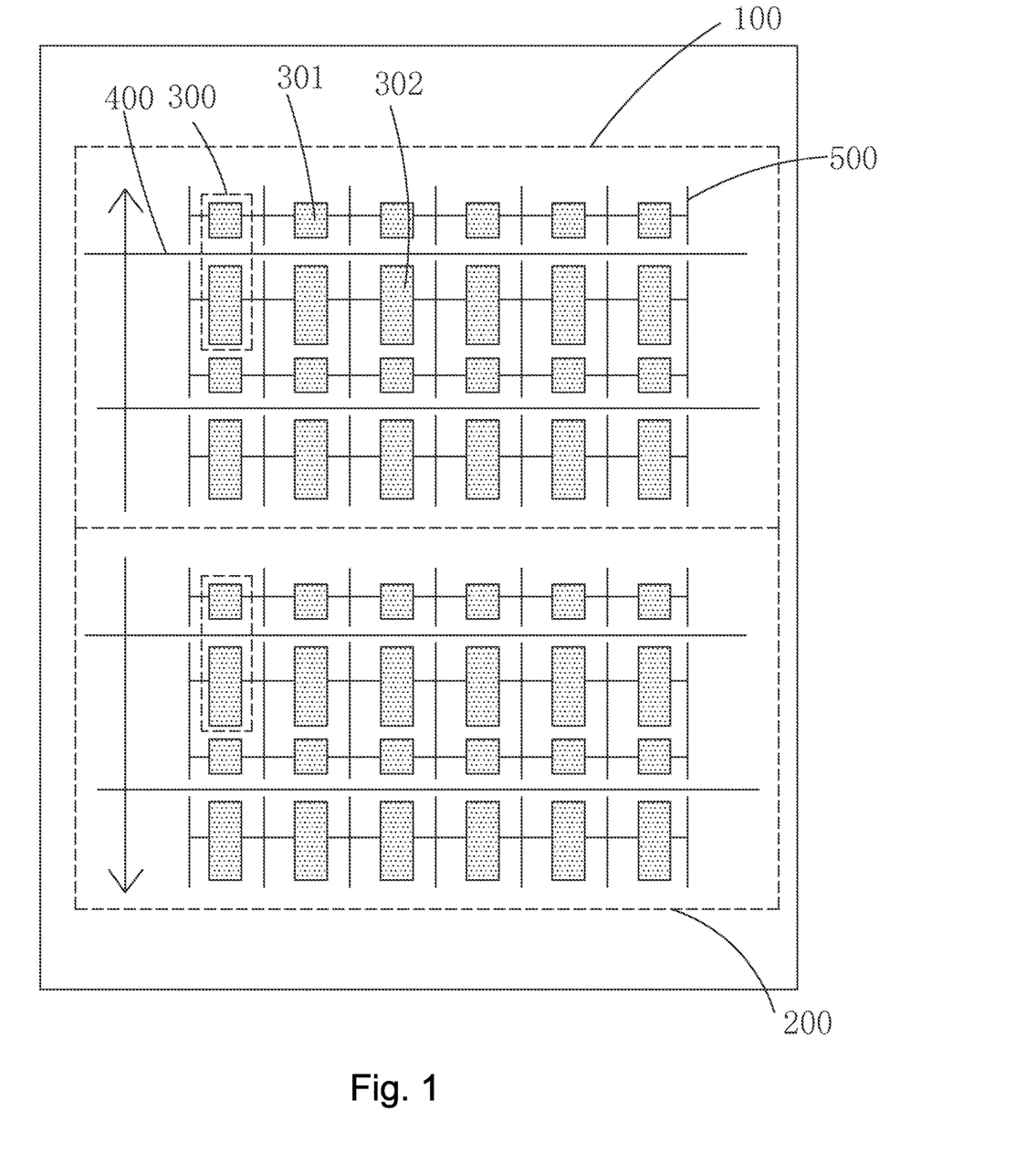
FIG. 1 is a schematic view illustrating a conventional thin-film transistor (TFT) substrate that adopts a screen-split arrangement.

Potential risks caused by high resolution and high refresh rate are issues concerning short charging time and insufficient charging rate of pixels. Solutions for such problems include adopting a TFT having an active layer having more carriers and a screen-split arrangement. As shown in FIG. 1, the so-called screen-split arrangement is to divide a display panel into an upper display area 100 and a lower display area 200. The upper display area 100 and the lower display area 200 carry out scanning operations that are performed simultaneously in opposite directions and are independent of each other, so that the number of scan lines to be scanned in a time period of one frame of image can be reduced by half and the charging time can be extended by double. However, heretofore, the upper display area 100 and the lower display area 200 are of completely identical structures and further, a main pixel electrode 301 and a sub pixel electrode 302 of one sub pixel 300 are respectively located on two opposite sides of the scan line 400 corresponding thereto. Thus, an array substrate common electrode (Acom) line 500 of one sub-pixel 300 on the same metal layer of the scan line 400 would be divided into two parts. Such a divided structure of the array substrate common electrode line 500 would cause a coupling signal in the sub pixel electrode 301 during a scanning operation of the array substrate and related to the location of the sub pixel electrode 301 that generates the coupling signal and the scanning direction. As shown in FIG. 1, the upper display area 100 has a scanning direction that goes from a lower side to an upper side. When the scanning of one scan line of the upper display area 100 is completed and terminated, a coupling signal will be generated in one line of sub pixel electrodes 301 that is adjacent to one line of main pixel electrodes 302 associated with the scan line and located above the line of main pixel electrodes 302. The lower display area 200 has a scanning direction that goes from an upper side to a lower side. When the scanning of one scan line 400 of the lower display area 200 is completed and terminated, a coupling signal will be generated in one line of sub pixel electrodes 301 that is adjacent to one line of main pixel electrodes 302 associated with the scan line and located below the line of main pixel electrodes 302. Under such a condition, the coupling signal provides different influences on the upper and lower display areas 100, 200. Particularly, in the lower display area 200, the coupling signal is generated in the sub pixel electrode 301 that have already been written with pixel voltages, and consequently, the levels of the written pixel voltages will be affected, leading to poor displaying.

SUMMARY OF THE INVENTION

An objective of the present invention is to provide a thin-film transistor (TFT) substrate, which prevents a coupling signal from affecting electrical voltage of a sub pixel electrode and ensures similar displaying effect for two display areas of a screen-split arrangement to thereby eliminate poor displaying.

To achieve the above objective, the present invention provides a TFT substrate, which comprises: a first display area and a second display area that are arranged sequentially in a vertical direction;

wherein the first display area and the second display area each comprise: a plurality of sub-pixels arranged in an array, a plurality of horizontal scan lines that are arranged parallel to and spaced from each other, and a plurality of array substrate common electrode lines;

each of rows of the sub-pixels corresponds to one of the scan lines, and each of the sub-pixels comprises: a main pixel electrode and a sub pixel electrode respectively located on two opposite sides of the one of the scan lines to which the sub-pixel correspond; and the plurality of array substrate common electrode lines and the plurality of scan lines are both located on a first metal layer and are arranged alternate with and spaced from each other;

the main pixel electrodes and the sub pixel electrodes of the first display area are in mirror symmetry with respect to the main pixel electrodes and the sub pixel electrodes of the second display area, respectively, about a horizontal division line of the first display area and the second display area; and the first display area has a scanning direction in which scanning is conducted from one side that the sub pixel electrode of one of the sub-pixels is located in the first display area toward one side that the main pixel electrode of the one of the sub-pixels is located and the second display area has a scanning direction that is opposite to the scanning direction of the first display area.

Each of the main pixel electrodes of the first display area is located on one side of the one of the scan lines corresponding thereto that is distant from the second display area and each of the sub pixel electrodes of the first display area is located on one side of the one of the scan lines corresponding thereto that is adjacent to the second display area, the scanning direction of the first display area being such that scanning is conducted from the side adjacent to the second display area toward the side distant from the second display area; and each of the main pixel electrodes of the second display area is located on one side of the one of the scan lines corresponding thereto that is distant from the first display area and each of the sub pixel electrodes of the second display area is located on one side of the one of the scan lines corresponding thereto that is adjacent to the first display area, the scanning direction of the second display area being such that scanning is conducted from the side adjacent to the first display area toward the side distant from the first display area.

Each of the main pixel electrodes of the first display area is located on one side of the one of the scan lines corresponding thereto that is adjacent to the second display area and each of the sub pixel electrodes of the first display area is located on one side of the one of the scan lines corresponding thereto that is distant from the second display area, the scanning direction of the first display area being such that scanning is conducted from the side distant from the second display area toward the side adjacent to the second display area; and each of the main pixel electrodes of the second display area is located on one side of the one of the scan lines corresponding thereto that is adjacent to the first display area and each of the sub pixel electrodes of the second display area is located on one side of the one of the scan lines corresponding thereto that is distant from the first display area, the scanning direction of the second display area being such that scanning is conducted from the side distant from the first display area toward the side adjacent to the first display area.

The first display area and the second display area each further comprise: a plurality of vertical data lines that are arranged parallel to and spaced from each other and each of the data lines corresponds to one of columns of the sub-pixels.

Each of the sub-pixels further comprises: a main thin-film transistor, a sub thin-film transistor, and a charge-sharing thin-film transistor;

the main thin-film transistor has a gate electrode electrically connected to the one of the scan lines to which the sub-pixel corresponds, a source electrode electrically connected to the one of the data lines to which the sub-pixel corresponds, and a drain electrode electrically connected to the main pixel electrode; the sub thin-film transistor has a gate electrode electrically connected to the one of the scan lines to which the sub-pixel corresponds, a source electrode electrically connected to the one of the data lines to which the sub-pixel corresponds, and a drain electrode electrically connected to the sub pixel electrode; the charge-sharing thin-film transistor has a gate electrode electrically connected to the one of the scan lines to which the sub-pixel corresponds, a source electrode electrically connected to the sub pixel electrode, and a drain electrode electrically connected to the array substrate common electrode line on one side of the sub-pixel where the sub pixel electrode is located; and the main pixel electrode and the array substrate common electrode line on the side where the main pixel electrode is located have parts overlapping each other to form a main storage capacitor and the sub pixel electrode and the array substrate common electrode line on the side where the sub pixel electrode is located have parts overlapping each other to form a sub storage capacitor.

The gate electrode of the main thin-film transistor, the gate electrode of the sub thin-film transistor, and the gate electrode of the charge-sharing thin-film transistor are all located on the first metal layer, and the source electrode and the drain electrode of the main thin-film transistor, the source electrode and the drain electrode of the sub thin-film transistor, the source electrode and the drain electrode of the charge-sharing thin-film transistor, and the data lines are all located on a second metal layer that overlaps the first metal layer and is insulated therefrom.

The main pixel electrode and the sub pixel electrode are both of a Pozidriv structure.

The main pixel electrode and the sub pixel electrode are formed of a material comprising indium tin oxide (ITO).

Scanning of the first display area and scanning of the second display area are conducted simultaneously and independently.

The present invention also provides a TFT substrate, which comprises: a first display area and a second display area that are arranged sequentially in a vertical direction;

wherein the first display area and the second display area each comprise: a plurality of sub-pixels arranged in an array, a plurality of horizontal scan lines that are arranged parallel to and spaced from each other, and a plurality of array substrate common electrode lines;

each of rows of the sub-pixels corresponds to one of the scan lines, and each of the sub-pixels comprises: a main pixel electrode and a sub pixel electrode respectively located on two opposite sides of the one of the scan lines to which the sub-pixel correspond; and the plurality of array substrate common electrode lines and the plurality of scan lines are both located on a first metal layer and are arranged alternate with and spaced from each other;

the main pixel electrodes and the sub pixel electrodes of the first display area are in mirror symmetry with respect to the main pixel electrodes and the sub pixel electrodes of the second display area, respectively, about a horizontal division line of the first display area and the second display area; and the first display area has a scanning direction in which scanning is conducted from one side that the sub pixel electrode of one of the sub-pixels is located in the first display area toward one side that the main pixel electrode of the one of the sub-pixels is located and the second display area has a scanning direction that is opposite to the scanning direction of the first display area;

wherein the first display area and the second display area each further comprise: a plurality of vertical data lines that are arranged parallel to and spaced from each other and each of the data lines corresponds to one of columns of the sub-pixels;

wherein each of the sub-pixels further comprises: a main thin-film transistor, a sub thin-film transistor, and a charge-sharing thin-film transistor;

the main thin-film transistor has a gate electrode electrically connected to the one of the scan lines to which the sub-pixel corresponds, a source electrode electrically connected to the one of the data lines to which the sub-pixel corresponds, and a drain electrode electrically connected to the main pixel electrode; the sub thin-film transistor has a gate electrode electrically connected to the one of the scan lines to which the sub-pixel corresponds, a source electrode electrically connected to the one of the data lines to which the sub-pixel corresponds, and a drain electrode electrically connected to the sub pixel electrode; the charge-sharing thin-film transistor has a gate electrode electrically connected to the one of the scan lines to which the sub-pixel corresponds, a source electrode electrically connected to the sub pixel electrode, and a drain electrode electrically connected to the array substrate common electrode line on one side of the sub-pixel where the sub pixel electrode is located; and the main pixel electrode and the array substrate common electrode line on the side where the main pixel electrode is located have parts overlapping each other to form a main storage capacitor and the sub pixel electrode and the array substrate common electrode line on the side where the sub pixel electrode is located have parts overlapping each other to form a sub storage capacitor;

wherein the main pixel electrode and the sub pixel electrode are both of a Pozidriv structure; and wherein scanning of the first display area and scanning of the second display area are conducted simultaneously and independently.

The efficacy of the present invention is as follows. The present invention provides a TFT substrate, which comprises: a first display area and a second display area that are sequentially arranged in a vertical direction. Main pixel electrodes and sub pixel electrodes of the first display area are arranged in mirror symmetry with respect to main pixel electrodes and sub pixel electrodes of the second display area, respectively, about a horizontal division line of the first display area and the second display area. Scanning directions of the first display area and the second display area are such that scanning is conducted from the side that the sub pixel electrodes of the sub-pixels are located toward the side that the main pixel electrodes are located so that both the first display area and the second display area generate, during scanning, a coupling signal first and then a pixel voltage is written in to thereby prevent the coupling signal from affecting the voltage of the sub pixel electrode and thus ensuring similar displaying effect for two display areas in a screen-split arrangement and avoiding poor displaying.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 2:
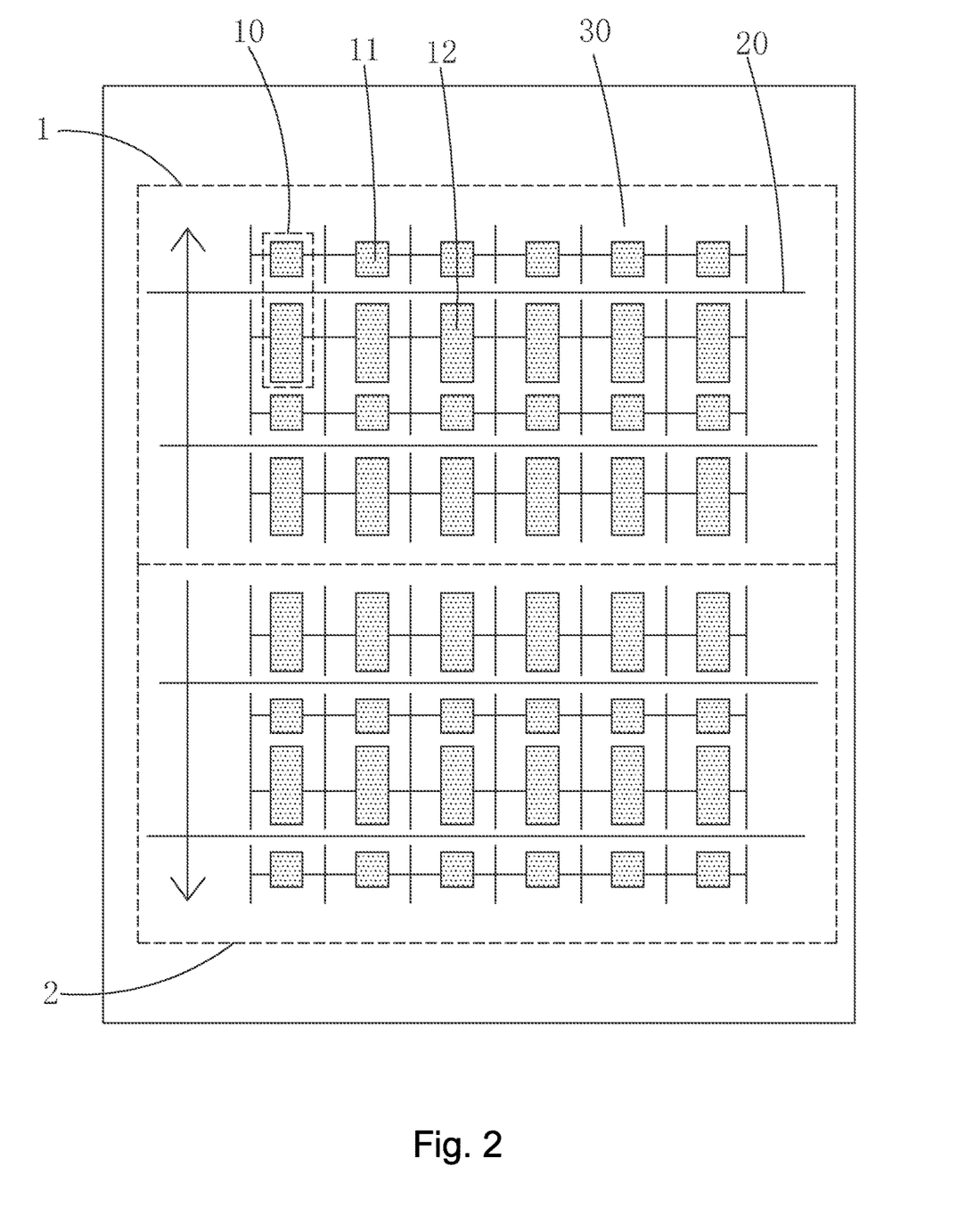
FIG. 2 is a schematic view illustrating a structure of a first embodiment of a TFT substrate according to the present invention.

Referring to FIG. 2, as a first embodiment of the present invention, the present invention provides a thin-film transistor (TFT) substrate, which comprises: a first display area 1 and a second display area 2 that are arranged sequentially in a vertical direction. The first display area 1 and the second display area 2 each comprise: a plurality of sub-pixels 10 arranged in an array, a plurality of scan lines 20 that are arranged parallel to and spaced from each other and extend in a horizontal direction, and a plurality of array substrate common electrode lines 30. Each of rows of the sub-pixels 10 corresponds to one of the scan lines 20, and each of the sub-pixels 10 comprises: a main pixel electrode 11 and a sub pixel electrode 12 respectively located on two opposite sides of the one of the scan lines 20 to which the sub-pixel 10 corresponds.

The plurality of array substrate common electrode lines 30 and the plurality of scan lines 20 are both located on a first metal layer and are arranged alternate with and spaced from each other.

The main pixel electrodes 11 and the sub pixel electrodes 12 of the first display area 1 are in mirror symmetry with respect to the main pixel electrodes 11 and the sub pixel electrodes 12 of the second display area 2, respectively, about a horizontal division line of the first display area 1 and the second display area 20.

Specifically, as shown in FIG. 2, each of the main pixel electrodes 11 of the first display area 1 is located on one side of the scan line 20 corresponding thereto that is distant from the second display area 2 and each of the sub pixel electrodes 12 of the first display area 1 is located on one side of the scan line 20 corresponding thereto that is adjacent to the second display area 2. The first display area 1 has a scanning direction in which scanning is conducted from one side that is adjacent to the second display area 2 toward one side that is distant from the second display area 2. Each of the main pixel electrodes 11 of the second display area 2 is located on one side of the scan line 20 corresponding thereto that is distant from the first display area 1 and each of the sub pixel electrodes 12 of the second display area 2 is located on one side of the scan line 20 corresponding thereto that is adjacent to the first display area 1. The second display area 2 has a scanning direction in which scanning is conducted from one side that is adjacent to the first display area 1 toward one side that is distant from the first display area 1.

Figure 3:
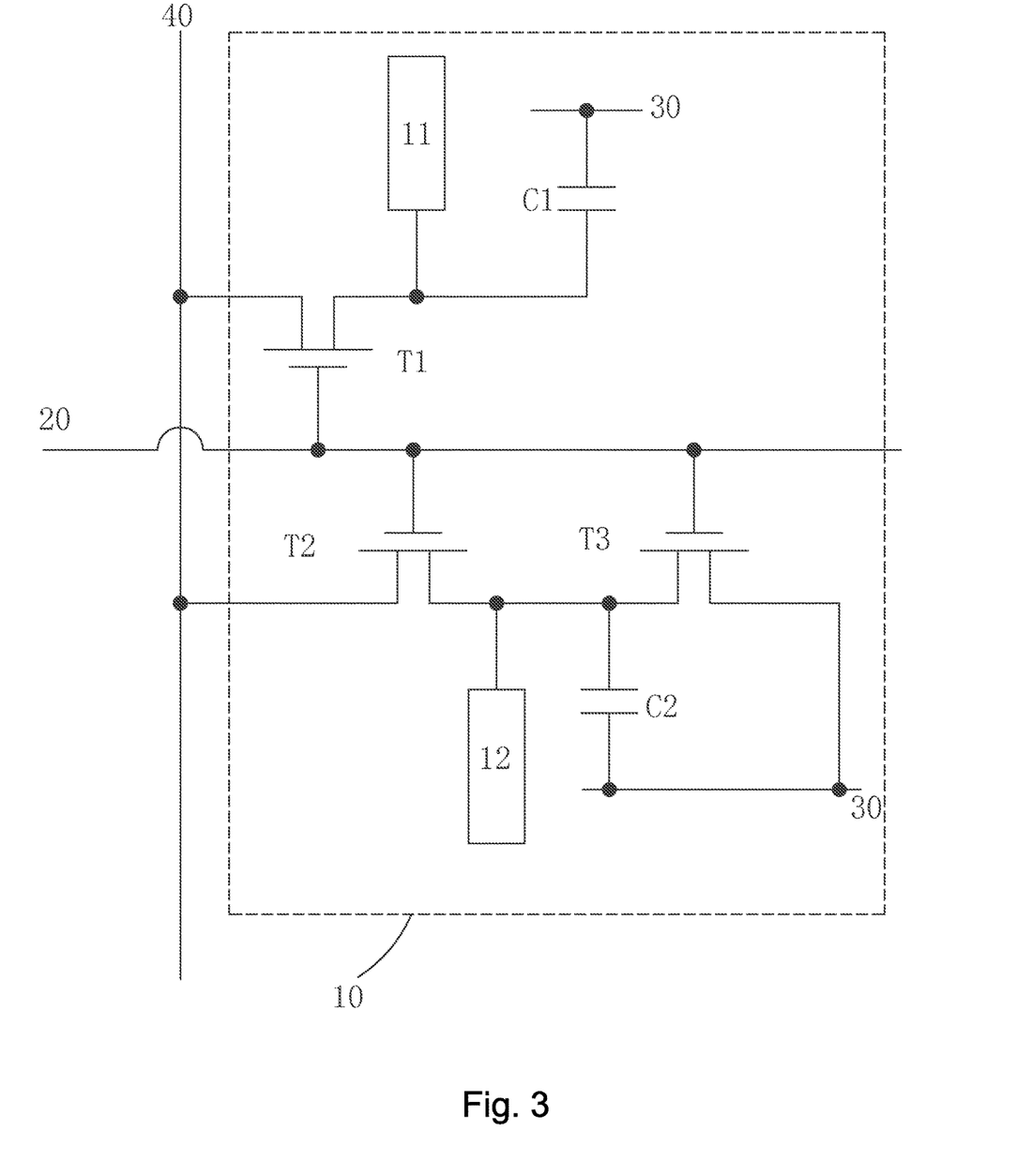
FIG. 3 is an equivalent circuit diagram of a sub-pixel of the TFT substrate according to the present invention.

Specifically, as shown in FIG. 3, the first display area 1 and the second display area 2 each further comprise: a plurality of data lines 40 that are arranged parallel to and spaced from each other and extend in the vertical direction and a plurality of array substrate common electrode lines 30. Each of the data lines 40 corresponds to one column of the sub-pixels 10. The plurality of array substrate common electrode lines 30 and the plurality of scan lines 20 are both located on the first metal layer and are arranged alternate with and spaced from each other. Each of the sub-pixels 10 further comprises: a main thin-film transistor T1, a sub thin-film transistor T2, and a charge-sharing thin-film transistor T3.

The main thin-film transistor T1 has a gate electrode electrically connected to the scan line 20 to which the sub-pixel 10 corresponds, a source electrode electrically connected to the data line 40 to which the sub-pixel 10 corresponds, and a drain electrode electrically connected to the main pixel electrode 11. The sub thin-film transistor T2 has a gate electrode electrically connected to the scan line 20 to which the sub-pixel 10 corresponds, a source electrode electrically connected to the data line 40 to which the sub-pixel 10 corresponds, and a drain electrode electrically connected to the sub pixel electrode 12. The charge-sharing thin-film transistor T3 has a gate electrode electrically connected to the scan line 20 to which the sub-pixel 10 corresponds, a source electrode electrically connected to the sub pixel electrode 12, and a drain electrode electrically connected to the array substrate common electrode line 30 on one side of the sub-pixel 10 where the sub pixel electrode 12 is located.

Figure 5:
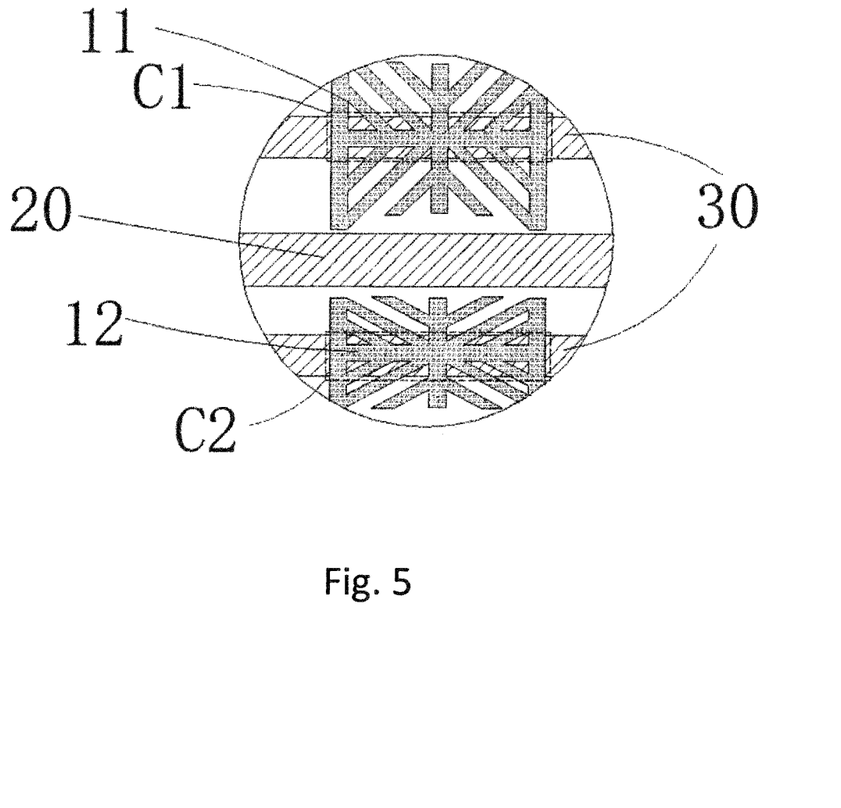
FIG. 5 illustrates a structure of the sub-pixel of the TFT substrate of FIG. 3.

The main pixel electrode 11 and the array substrate common electrode line 30 on the side where the main pixel electrode 11 is located have parts overlapping each other to form a main storage capacitor C1 and the sub pixel electrode 12 and the array substrate common electrode line 30 on the side where the sub pixel electrode 12 is located have parts overlapping each other to form a sub storage capacitor C2 (see FIGS. 3 and 5).

Further, the gate electrode of the main thin-film transistor T1, the gate electrode of the sub thin-film transistor T2, and the gate electrode of the charge-sharing thin-film transistor T3 are all located on the first metal layer. The source electrode and the drain electrode of the main thin-film transistor T1, the source electrode and the drain electrode of the sub thin-film transistor T2, the source electrode and the drain electrode of the charge-sharing thin-film transistor T3, and the data lines 40 are all located on a second metal layer that overlaps the first metal layer and is insulated therefrom.

Specifically, the main pixel electrode 11 and the sub pixel electrode 12 are both of a Pozidriv structure. Preferably, the main pixel electrode 11 and the sub pixel electrode 12 are formed of a material comprising indium tin oxide (ITO).

Specifically, for scanning of the TFT substrate of the present invention, a frame of image is divided into two scanning part, wherein one of the scanning parts is conducted with the first display area 1 and another one of the scanning parts is conducted with the second display area 2. After the scanning conducted with the first display area 1 and the second display area 2, combination is made to form and display the image of the frame. In other words, the scanning operation of the first display area 1 and the scanning operation of the second display area 2 are conducted simultaneously but independently so that charging time of each of the sub-pixels 10 can be extended by double to avoid insufficiency of charging of the sub-pixel 10.

It is noted that an operation of the TFT substrate is as follows. The first display area 1 and the second display area 2 start scanning operations at the same time, wherein the first display area 1 conducts the scanning operation from the side adjacent to the second display area 2 toward the side distant from the second display area 2 and, simultaneously, the second display area 2 conducts the scanning operation from the side adjacent to the first display area 1 toward the side distant from the first display area 1. In other words, the first display area 1 conducts scanning from the lower side to the upper side, while the second display area 2 conducts scanning from the upper side toward the lower side. In the first display area 1, a lowest one of the scan lines 20 of the first display area 1 is turned on first to allow pixel voltages to be written into the main pixel electrodes 11 and the sub pixel electrodes 12 of a lowest one of the rows of the sub-pixels 10 of the first display area 1. Then, the lowest one of the scan lines 20 of the first display area 1 is turned off and a coupling signal is generated and changes voltages of the sub pixel electrodes 12 of a second row of the sub-pixels 10 of the first display area 1 counting in a direction from lower side to upper side. Then, a second one of the scan lines 20 of the first display area 1 counting in the direction from lower side to upper side is turned on to allow pixel voltages to be written into the main pixel electrodes 11 and the sub pixel electrodes 12 of a second row of the sub-pixels 10 of the first display area 1 counting in the direction from lower side to upper side. This is repeatedly performed in sequence for the subsequent rows until scanning of a highest one of the scan lines 20 of the first display area 1 is completed. In the second display area 2, a highest one of the scan lines 20 of the second display area 2 is turned on first to allow pixel voltages to be written into the main pixel electrodes 11 and the sub pixel electrodes 12 of a highest one of the rows of the sub-pixels 10 of the second display area 2. Then, the highest one of the scan lines 20 of the second display area 2 is turned off and a coupling signal is generated and changes voltages of the sub pixel electrodes 12 of a second row of the sub-pixels 10 of the second display area 2 counting in a direction from upper side to lower side. Then, a second one of the scan lines 20 of the second display area 2 counting in the direction from upper side to lower side is turned on to allow pixel voltages to be written into the main pixel electrodes 11 and the sub pixel electrodes 12 of a second row of the sub-pixels 10 of the first display area 1 counting in the direction from upper side to lower side. This is repeatedly performed in sequence for the subsequent rows until scanning of a lowest one of the scan lines 20 of the second display area 2 is completed.

It can be seen from the above-described process of operation that in the TFT substrate of the present invention, for both the first display area 1 and the second display area 2, a coupling signal that affects the voltages of the sub pixel electrodes 12 is generated first and the pixel voltage are then written into the sub pixel electrodes 12 so that the pixels voltage may overwrite the voltages induced by the coupling signal thereby effectively avoiding the influence that the coupling signal imposes on the sub pixel electrodes 12 and reducing poor displaying. For comparison purpose, as shown in FIG. 1, in the prior art, in the second display area 200, the pixel voltages are first written into the sub pixel electrodes 302 and the coupling signal that affects the voltages of the sub pixel electrodes 302 are then generated so that the pixel voltages that have been written into the sub pixel electrodes 302 would be changed by the coupling signal and causing poor displaying.

Figure 4:
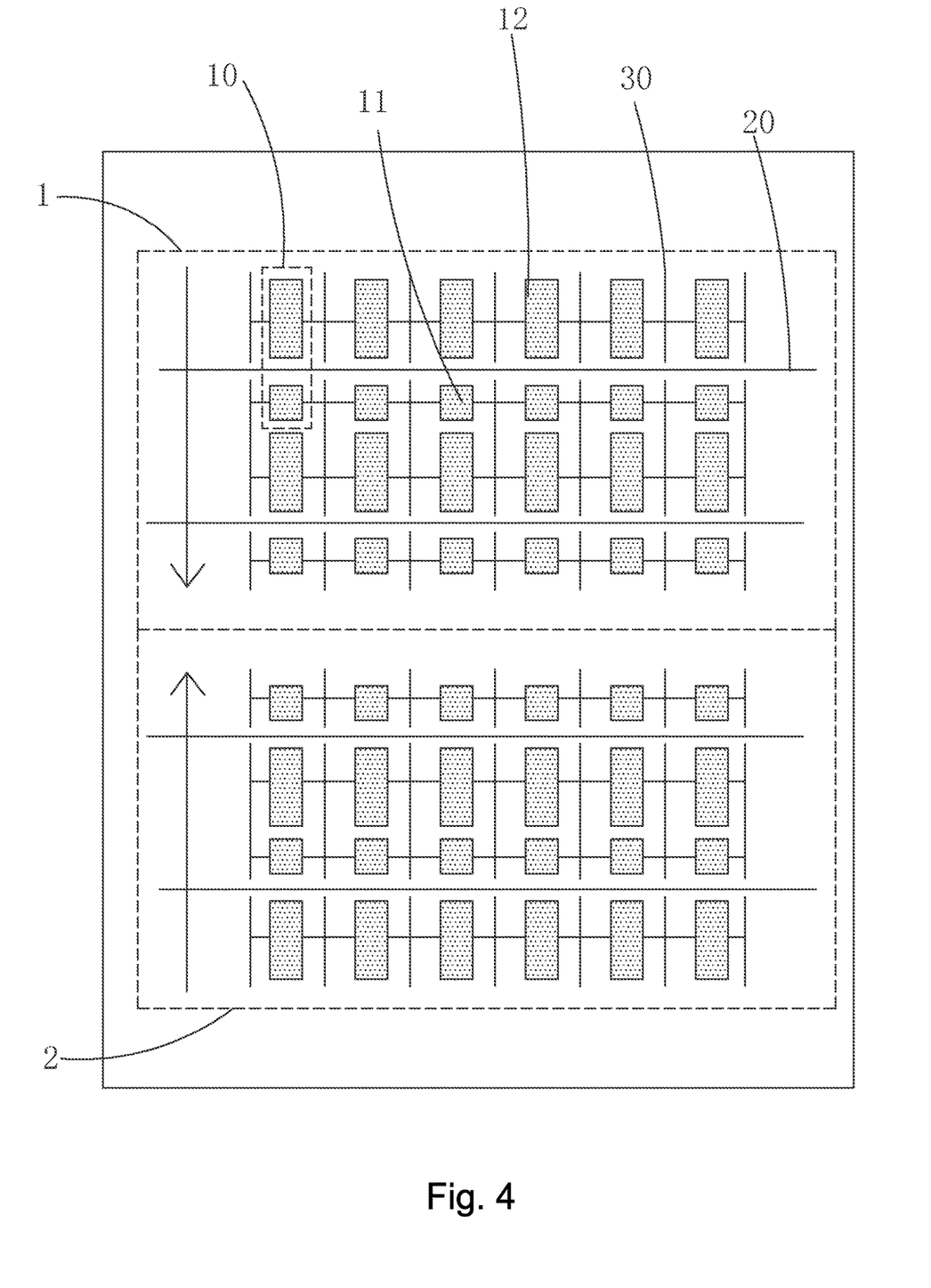
FIG. 4 is a schematic view illustrating a structure of a second embodiment of the TFT substrate according to the present invention.

Specifically, as shown in FIG. 4, FIG. 4 shows a second embodiment of the present invention, which is different from the first embodiment in that in the first display area 1, each of the main pixel electrodes 11 is located on one side of the scan line 20 corresponding thereto that is adjacent to the second display area 2 and in the first display area 1, each of the sub pixel electrodes 12 is located on one side of the scan line 20 corresponding thereto that is distant from the second display area 2. The first display area 1 has a scanning direction in which a scanning operation is conducted from the side distant from the second display area 2 toward the side adjacent to the second display area 2. In the second display area 2, each of the main pixel electrodes 11 is located on one side of the scan line 20 corresponding thereto that is adjacent to the first display area 1 and in the second display area 2, each of the sub pixel electrodes 12 is located on one side of the scan line 20 corresponding thereto that is distant from the first display area 1. The second display area 2 has a scanning direction in which a scanning operation is conducted from the side distant from the first display area 1 toward the side adjacent to the first display area 1. The remaining is the same as the first embodiment and repeated description will be omitted herein.

In other words, for the TFT substrate of the present invention, for both the first embodiment and the second embodiment, the scanning directions of the first display area 1 and the second display area 2 are such that scanning is conducted from one side that the sub pixel electrode 12 of the sub pixel 10 of the display area is located toward one side that the main pixel electrode 11 of the sub pixel 10 is located. Thus, after the scanning of each of the scan lines 20 is completed, a coupling signal is always generated on a corresponding sub pixel electrode 12 of the next scan line 20 to be scanned so as to ensure the scanning of both the first display area 1 and the second display area 2 is such that the coupling signal that affects the voltage of the sub pixel electrode 12 is generated first and the pixel voltage is then written into the sub pixel electrode 12.

In summary, the present invention provides a TFT substrate, which comprises: a first display area and a second display area that are sequentially arranged in a vertical direction. Main pixel electrodes and sub pixel electrodes of the first display area are arranged in mirror symmetry with respect to main pixel electrodes and sub pixel electrodes of the second display area, respectively, about a horizontal division line of the first display area and the second display area. Scanning directions of the first display area and the second display area are such that scanning is conducted from the side that the sub pixel electrodes of the sub-pixels are located toward the side that the main pixel electrodes are located so that both the first display area and the second display area generate, during scanning, a coupling signal first and then a pixel voltage is written in to thereby prevent the coupling signal from affecting the voltage of the sub pixel electrode and thus ensuring similar displaying effect for two display areas in a screen-split arrangement and avoiding poor displaying.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A thin-film transistor (TFT) substrate, comprising: a first display area and a second display area that are arranged sequentially in a vertical direction;
    wherein the first display area and the second display area each comprise: a plurality of sub-pixels arranged in an array, a plurality of horizontal scan lines that are arranged parallel to and spaced from each other, and a plurality of array substrate common electrode lines;
    each row of the sub-pixels corresponds to one of the scan lines, and each of the sub-pixels comprises: a main pixel electrode and a sub pixel electrode respectively located on two opposite sides of the one of the scan lines to which the sub-pixel correspond; and the plurality of array substrate common electrode lines and the plurality of scan lines are both located on a first metal layer and are arranged alternate with and spaced from each other;
    the main pixel electrodes and the sub pixel electrodes of the first display area are in mirror symmetry with respect to the main pixel electrodes and the sub pixel electrodes of the second display area, respectively, about a horizontal division line of the first display area and the second display area; and
    the first display area has a scanning direction in which scanning is conducted from one side that the sub pixel electrode of one of the sub-pixels is located in the first display area toward one side that the main pixel electrode of the one of the sub-pixels is located and the second display area has a scanning direction that is opposite to the scanning direction of the first display area;
    wherein the first display area and the second display area each further comprise: a plurality of vertical data lines that are arranged parallel to and spaced from each other and each of the data lines corresponds to one of columns of the sub-pixels; each of the sub-pixels further comprises: a main thin-film transistor, a sub thin-film transistor, and a charge-sharing thin-film transistor; the main thin-film transistor has a gate electrode electrically connected to the one of the scan lines to which the sub-pixel corresponds, a source electrode electrically connected to the one of the data lines to which the sub-pixel corresponds, and a drain electrode electrically connected to the main pixel electrode; the sub thin-film transistor has a gate electrode electrically connected to the one of the scan lines to which the sub-pixel corresponds, a source electrode electrically connected to the one of the data lines to which the sub-pixel corresponds, and a drain electrode electrically connected to the sub pixel electrode; the charge-sharing thin-film transistor has a gate electrode electrically connected to the one of the scan lines to which the sub-pixel corresponds, a source electrode electrically connected to the sub pixel electrode, and a drain electrode electrically connected to the array substrate common electrode line on one side of the sub-pixel where the sub pixel electrode is located.

2. The TFT substrate according to claim 1, wherein each of the main pixel electrodes of the first display area is located on one side of the one of the scan lines corresponding thereto that is distant from the second display area and each of the sub pixel electrodes of the first display area is located on one side of the one of the scan lines corresponding thereto that is adjacent to the second display area, the scanning direction of the first display area being such that scanning is conducted from the side adjacent to the second display area toward the side distant from the second display area; and
    each of the main pixel electrodes of the second display area is located on one side of the one of the scan lines corresponding thereto that is distant from the first display area and each of the sub pixel electrodes of the second display area is located on one side of the one of the scan lines corresponding thereto that is adjacent to the first display area, the scanning direction of the second display area being such that scanning is conducted from the side adjacent to the first display area toward the side distant from the first display area.

3. The TFT substrate according to claim 1, wherein the gate electrode of the main thin-film transistor, the gate electrode of the sub thin-film transistor, and the gate electrode of the charge-sharing thin-film transistor are all located on the first metal layer, and the source electrode and the drain electrode of the main thin-film transistor, the source electrode and the drain electrode of the sub thin-film transistor, the source electrode and the drain electrode of the charge-sharing thin-film transistor, and the data lines are all located on a second metal layer that overlaps the first metal layer and is insulated therefrom.

4. The TFT substrate according to claim 1, wherein the main pixel electrode and the sub pixel electrode are both of a Pozidriv structure.

5. The TFT substrate according to claim 1, wherein the main pixel electrode and the sub pixel electrode are formed of a material comprising indium tin oxide (ITO).

6. The TFT substrate according to claim 1, wherein scanning of the first display area and scanning of the second display area are conducted simultaneously and independently.

7. A thin-film transistor (TFT) substrate, comprising: a first display area and a second display area that are arranged sequentially in a vertical direction;
   wherein the first display area and the second display area each comprise: a plurality of sub-pixels arranged in an array, a plurality of horizontal scan lines that are arranged parallel to and spaced from each other, and a plurality of array substrate common electrode lines;
   each of rows of the sub-pixels corresponds to one of the scan lines, and each of the sub-pixels comprises: a main pixel electrode and a sub pixel electrode respectively located on two opposite sides of the one of the scan lines to which the sub-pixel correspond; and the plurality of array substrate common electrode lines and the plurality of scan lines are both located on a first metal layer and are arranged alternate with and spaced from each other;
   the main pixel electrodes and the sub pixel electrodes of the first display area are in mirror symmetry with respect to the main pixel electrodes and the sub pixel electrodes of the second display area, respectively, about a horizontal division line of the first display area and the second display area;
   the first display area has a scanning direction in which scanning is conducted from one side that the sub pixel electrode of one of the sub-pixels is located in the first display area toward one side that the main pixel electrode of the one of the sub-pixels is located and the second display area has a scanning direction that is opposite to the scanning direction of the first display area;
   wherein the first display area and the second display area each further comprise: a plurality of vertical data lines that are arranged parallel to and spaced from each other and each of the data lines corresponds to one of columns of the sub-pixels;
   wherein each of the sub-pixels further comprises: a main thin-film transistor, a sub thin-film transistor, and a charge-sharing thin-film transistor;
   the main thin-film transistor has a gate electrode electrically connected to the one of the scan lines to which the sub-pixel corresponds, a source electrode electrically connected to the one of the data lines to which the sub-pixel corresponds, and a drain electrode electrically connected to the main pixel electrode; the sub thin-film transistor has a gate electrode electrically connected to the one of the scan lines to which the sub-pixel corresponds, a source electrode electrically connected to the one of the data lines to which the sub-pixel corresponds, and a drain electrode electrically connected to the sub pixel electrode; the charge-sharing thin-film transistor has a gate electrode electrically connected to the one of the scan lines to which the sub-pixel corresponds, a source electrode electrically connected to the sub pixel electrode, and a drain electrode electrically connected to the array substrate common electrode line on one side of the sub-pixel where the sub pixel electrode is located; and
   the main pixel electrode and the array substrate common electrode line on the side where the main pixel electrode is located have parts overlapping each other to form a main storage capacitor and the sub pixel electrode and the array substrate common electrode line on the side where the sub pixel electrode is located have parts overlapping each other to form a sub storage capacitor;
   wherein the main pixel electrode and the sub pixel electrode are both of a Pozidriv structure; and
   wherein scanning of the first display area and scanning of the second display area are conducted simultaneously and independently.

8. The TFT substrate according to claim 7, wherein each of the main pixel electrodes of the first display area is located on one side of the one of the scan lines corresponding thereto that is distant from the second display area and each of the sub pixel electrodes of the first display area is located on one side of the one of the scan lines corresponding thereto that is adjacent to the second display area, the scanning direction of the first display area being such that scanning is conducted from the side adjacent to the second display area toward the side distant from the second display area; and
   each of the main pixel electrodes of the second display area is located on one side of the one of the scan lines corresponding thereto that is distant from the first display area and each of the sub pixel electrodes of the second display area is located on one side of the one of the scan lines corresponding thereto that is adjacent to the first display area, the scanning direction of the second display area being such that scanning is conducted from the side adjacent to the first display area toward the side distant from the first display area.

9. The TFT substrate according to claim 7, wherein the gate electrode of the main thin-film transistor, the gate electrode of the sub thin-film transistor, and the gate electrode of the charge-sharing thin-film transistor are all located on the first metal layer, and the source electrode and the drain electrode of the main thin-film transistor, the source electrode and the drain electrode of the sub thin-film transistor, the source electrode and the drain electrode of the charge-sharing thin-film transistor, and the data lines are all located on a second metal layer that overlaps the first metal layer and is insulated therefrom.

10. The TFT substrate according to claim 7, wherein the main pixel electrode and the sub pixel electrode are formed of a material comprising indium tin oxide (ITO).

* * * * *